(12) United States Patent
Wang et al.

(10) Patent No.: US 6,421,757 B1
(45) Date of Patent: Jul. 16, 2002

(54) METHOD AND APPARATUS FOR CONTROLLING THE PROGRAMMING AND ERASING OF FLASH MEMORY

(75) Inventors: Peiqing Wang, Los Angeles; Srinjoy Das, Irvine, both of CA (US)

(73) Assignee: Conexant Systems, Inc, Newport Beach, CA (US)

( * ) Notice: Subject to any disclaimer, the term of this patent is extended or adjusted under 35 U.S.C. 154(b) by 0 days.

(21) Appl. No.: 09/163,776

(22) Filed: Sep. 30, 1998

(51) Int. Cl.[7] .............................................. G06F 12/00
(52) U.S. Cl. ...................... 711/103; 711/154; 711/167; 365/185.22; 365/185.33
(58) Field of Search ................................. 711/103, 154, 711/167; 365/185.22, 185.19, 185.33, 189.09

(56) References Cited

U.S. PATENT DOCUMENTS

| | | | |
|---|---|---|---|
| 5,509,134 A | * 4/1996 | Fandrich et al. ............. | 711/103 |
| 5,541,879 A | * 7/1996 | Suh et al. ............... | 365/185.22 |
| 5,627,784 A | * 5/1997 | Roohparvar ........... | 365/189.01 |
| 5,805,501 A | * 9/1998 | Shiau et al. ........... | 365/185.29 |

OTHER PUBLICATIONS

*High–Voltage Switching for Flash Memory Programming*, Micron Technology, Inc., Mar., 1998, Technical Note, TN–28–08, pp. 1–2.

*EEPROM Replacement with Flash Memory*, Intel, Mar., 1997, pp. 1,3, and 5–20.

* cited by examiner

*Primary Examiner*—Matthew Kim
*Assistant Examiner*—Matthew D. Anderson
(74) *Attorney, Agent, or Firm*—Thomas, Kayden, Horstemeyer & Risley, LLP

(57) ABSTRACT

A method and apparatus for automating and controlling the programming operations in a flash memory is provided to enable a microcontroller to accomplish various other controlling tasks while the programming operations are being conducted. A state machine is provided for controlling a plurality of sequences utilized in programming the flash memory, with various functional circuits provided to facilitate the programming and verification of flash memory cells. In a preferred embodiment, the reprogramming of the flash cells is limited to those flash cells verified as a programming failure, thus reducing the necessary programming of the flash memory cells which may impede the ability to program those flash cells. The control system may also be configured to provide for automating and controlling the erasing operations in a flash memory. The common interface circuitry may be employed to facilitates automation and control of both programming and erasing functions.

10 Claims, 8 Drawing Sheets

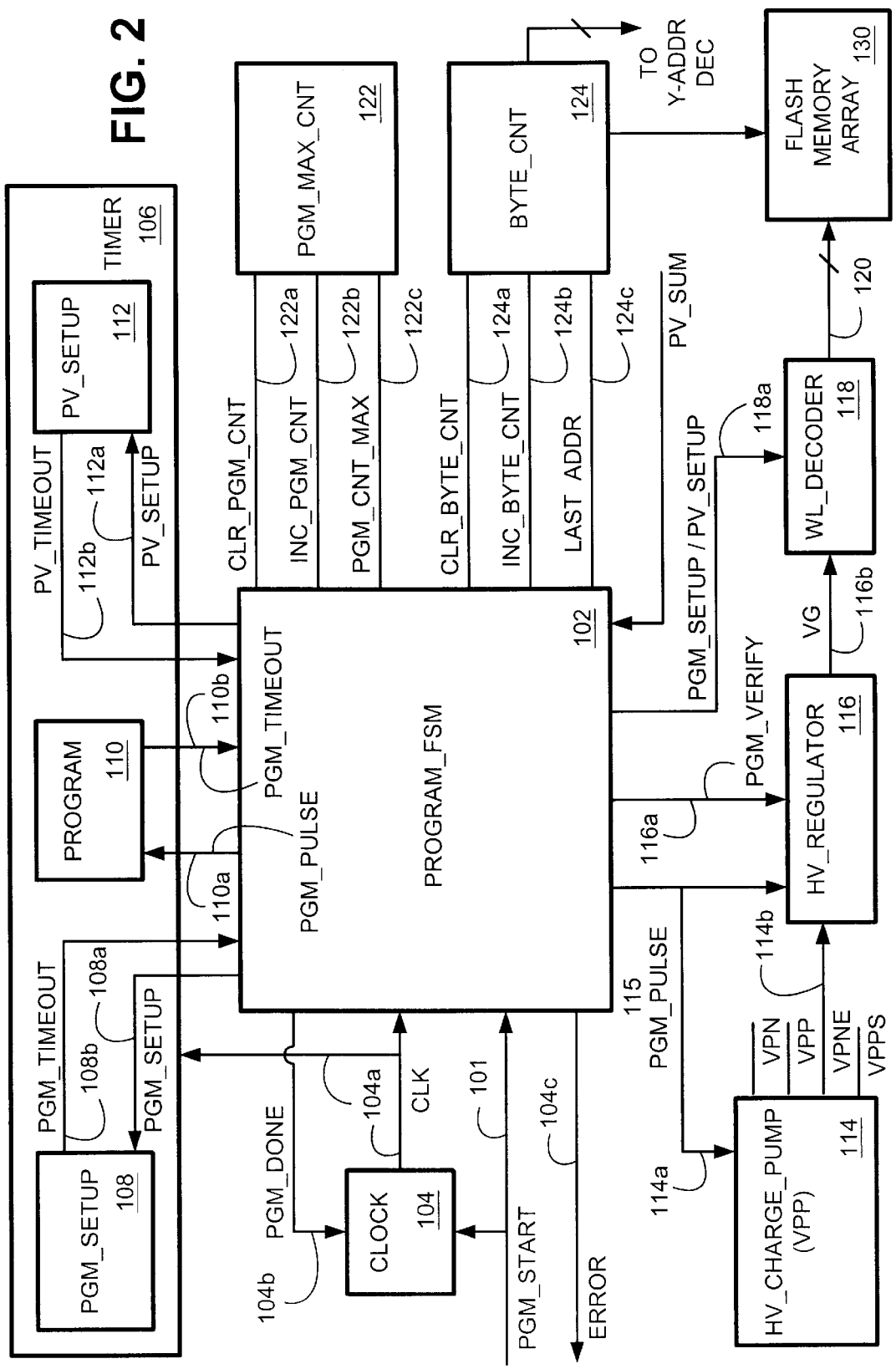

METHOD AND APPARATUS FOR CONTROLLING THE PROGRAMMING AND ERASING OF FLASH MEMORY

TECHNICAL FIELD

The present invention relates, generally, to a sequence controller for performing operations in a flash memory and, more particularly, to an on-chip state machine for automating program and erase functions in a flash memory.

BACKGROUND ART

With the ever increasing demand for cellular telephones and related telecommunication technologies, companies providing these products and services are continuously looking for ways to improve the cost, reliability and performance of their products and services. In order to improve a the performance and yet reduce the cost of cellular phone systems in general, one trend is for manufacturers and designers of microprocessor systems to replace a portion or all of the existing Electrically-Erasable and Programmable Read-Only Memory (EPROM) memory with Flash memory.

Flash memory is being increasingly incorporated into a wide variety of applications, such as, for example, digital cellular phones and other wireless applications, various peripheral devices such as modems, fax machines and printers, and other types of control systems. Flash memory typically offers various advantages over other types of memory, including RAM, ROM and EEPROM. For example, flash memory can often provide the electrical erasability features of random access memory (RAM), yet also provide the nonvolatility features of read only memory (ROM) utilized to retain stored information after power is terminated. Typically, flash memory stores information and data as a voltage charge on the floating gate of a transistor while other memory types, in general, require the use of additional components to facilitate the storage of the charge or to keep the memory latched, possibly resulting in a more expensive means for storing information. Further, flash memory generally provides for the programming of information or data by changing the logic of the flash cells, i.e., from a logic "1" to a logic "0", by setting a control gate voltage Vcg to a sufficiently high programming voltage, grounding the a source, and then setting the drain voltage to less than the programming voltage, thus facilitating the transfer of a number of electrons to the floating gate. Although this programming of the flash cells is typically done on a byte level, recent technologies have provided for the programming of the flash memory cells on a bit by bit level. However, unlike RAM memory, flash memory typically cannot be erased on a byte level, but instead requires the erasing of memory cells on a larger scale, such as a sector of memory, i.e, a block of memory generally 1 k or greater.

In general, microcontroller-based systems, such as cellular telephone systems, that utilize flash memory typically comprise a host system, e.g., a microcontroller, that interfaces with the flash memory to program and erase the flash memory as desired. For example, as used in the context of a cellular telephone application, a user may enter a phone number onto a keypad to indicate a desired number to be stored for later retrieval. Once the number has been entered, the microprocessor will store the number by programming it into the flash memory. Upon receiving a request for the programmed number, the microprocessor will access the flash memory and retrieve the number for display. Alternatively, the user may desire for a preprogrammed number to be removed from the stored memory. Upon receiving the proper command, the microprocessor accesses the flash memory location in which the preprogrammed number is stored and erases the contents of flash memory for that location.

Although the programming and erasing functions of the flash memory can be facilitated by the microcontroller, these functions can compromise or even preclude the microcontroller from performing other suitable or desired functions, e.g. displaying information or transmitting information, due to the need for the microcontroller to complete the potentially time-delaying tasks of programming and erasing the flash memory. As a result, the operation of the microcontroller is somewhat hindered by the often substantially simultaneous multiple requirements of displaying, transmitting, storing, programming and erasing information and data.

Methods and apparatus are thus needed to overcome these and other shortcomings in the prior art. Specifically, methods and apparatus are needed for automating the program and erase functions in a flash memory thus allowing the host system to perform other tasks and operations.

SUMMARY OF THE INVENTION

The present invention provides methods and apparatus for automating and controlling the programming operations in a flash memory, as well as for automating and controlling the erasing operations in a flash memory One advantage of the present invention is that reprogramming of the flash cells may be limited to those flash cells verified as a programming failure, thus reducing the unnecessary programming (or reprogramming) of flash cells.

A further advantage of the present invention is that the timers for controlling the programming and erasing operations are readily configurable without affecting the performance of the sequence controller.

Another advantage of the present invention is that the common interface circuitry may be employed to facilitate automation and control of both programming and erasing functions.

Another advantage of the present invention is that with a significant amount of control logic resident in a finite state machine, the design of the peripheral circuits is simplified.

A preferred embodiment of the present invention provides a state machine having handshaking capabilities for managing and coordinating a synchronized operation in a manner which mitigates timing hazards. Additionally, the handshaking capabilities help to ensure that programming and erasing sequences are properly executed with surrounding circuitry.

In accordance with a further aspect of the present invention, a state machine is provided which facilitates the resetting of functions and operations in a desired sequence.

The above and other advantages of the present invention may be carried out in one form by methods and apparatus for automating the programming or erasing functions in the flash memory, including the verifying of the programming or erasing sequences, through the use of a state machine operatively coupled to a flash memory and including a plurality of functional blocks configured to facilitate the programming and erasing operations.

BRIEF DESCRIPTION OF DRAWING FIGURES

A more complete understanding of the present invention may be derived by referring to the detailed description and claims when considered in connection with the Figures, wherein like reference numbers refer to similar elements throughout the Figures, and:

FIG. 2 is a schematic representation of an exemplary state machine for programming flash memory;

DETAILED DESCRIPTION OF PREFERRED EXEMPLARY EMBODIMENTS

The present invention may be described herein in terms of functional block components and various processing steps. It should be appreciated that such functional blocks may be realized by any number of hardware components configured to perform the specified functions. For example, the present invention may employ various integrated circuit components, e.g. memory elements, digital signal processing elements, timing devices and the like, which may carry out a variety of functions under the control of one or more microprocessors or other control devices. In addition, the present invention may be practiced in any number of applications and the state machine described herein is merely one exemplary application of the invention. Further, it should be noted that the present invention may employ any number of conventional techniques for data transmission, storage, signal processing and conditioning, and the like. Such general techniques that may be known to those skilled in the art are not described in detail herein.

Figure 1:
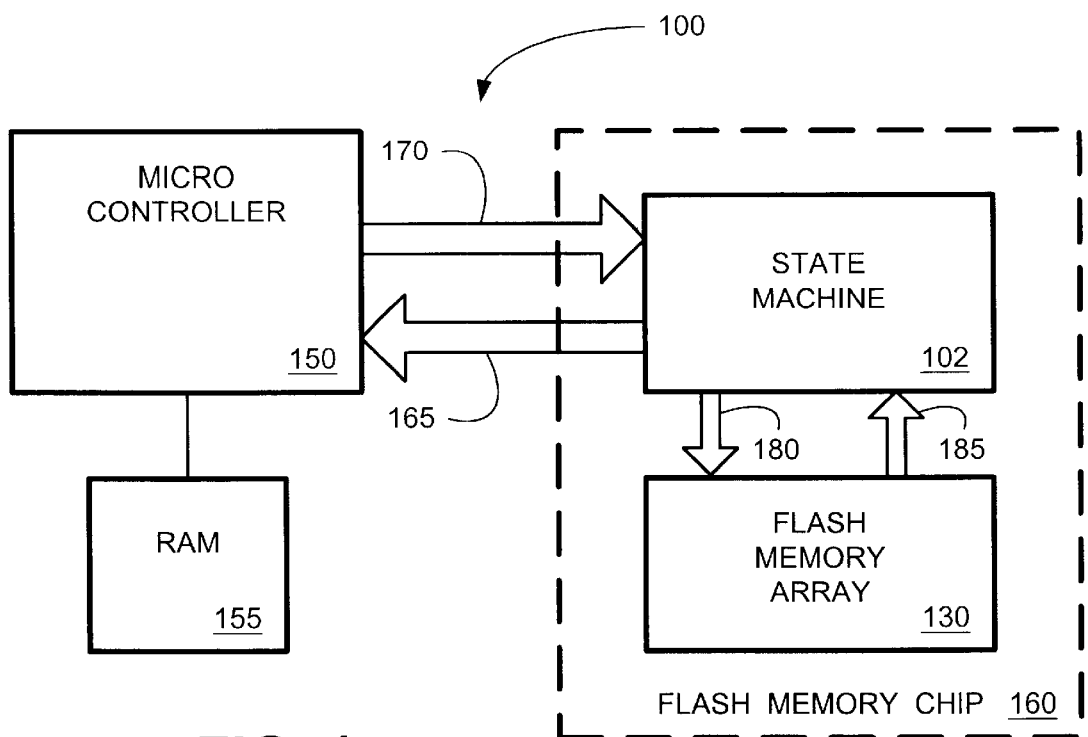
FIG. 1 is a block diagram of an exemplary embodiment in which principles of the present invention may be incorporated.

A microprocessor system for providing various input capabilities and corresponding output capabilities for various devices in accordance with the present invention typically involves the use a microcontroller to program or erase flash memory cells. With reference to FIG. 1, an exemplary embodiment of the present invention will be described in the context of a state machine configured for programming and erasing flash memory.

In this regard, the term "state machine" generally refers to a graphical technique for modeling a system in which all values are discrete. In accordance with the present invention, microprocessor system 100 includes an input/output device 150 and a flash memory chip 160. Input/output device 150 generally comprises a microcontroller configured to interface with flash memory chip 160 and may be incorporated into one of several known devices which utilize flash memory, such as, for example, cellular phones. Further, system 100 preferably provides various inputs 165 and outputs 170 (for example as discussed in connection with FIG. 2) to facilitate the interfacing between device 150 and flash memory chip 160, as well as RAM memory 155.

In accordance with a preferred embodiment, flash memory chip 160 suitably comprises a state machine 102 and a flash memory array 130. As will be discussed in further detail below, in accordance with this aspect of the invention, state machine 102 suitably provides for the programming or erasing of the contents of flash memory cells, such as those used in cellular phone applications. Further, in accordance with a preferred embodiment, flash memory array 130 may comprise any type of flash memory utilized in microprocessor systems, now known or hereafter devised. Moreover, state machine 102 and array 130 may be implemented on the same device (e.g. state machine 102 embedded on flash memory chip 160), incorporated into an integrated circuit, or otherwise implemented as desired. In this regard, for purposes of this discussion, the term "state machine" may refer to the device or component 102 or, alternatively, the term "state machine" may refer to the function performed by the component.

In accordance with an exemplary embodiment of the present invention, a state machine utilized for programming flash memory will now be described with reference to FIG. 2. State machine 102 suitably interfaces with various functional blocks including a clock 104, a timer 106, a high voltage charge pump 114, a high voltage regulator 116, a decoder 118, a program verify counter 122, and a byte counter 124. State machine 102 is configured to provide a sequence controller for programming the flash memory array 130, in cooperation with the various circuit blocks described above.

In accordance with the present invention, clock 104 is preferably a dedicated clock for state machine 102 and is configured to provide the clock pulses utilized in the sequencing of the various operations. Moreover, clock 104 may be configured to operate at different frequencies during the sequence of operations. Timer 106 is suitably configured to control the amount of time of different program sequences or functions (i.e., the duration of respective timing windows associated with programming sequences) of state machine 102 during programming of the flash memory, including high voltage charging, program verification and the selection of flash cells to be programmed. Preferably, high voltage charge pump 114 is configured to generate high voltage for the state machine 102 when programming flash memory cells while high voltage regulator 116 is configured to change or switch the high voltage level of the control gate of the flash memory cells, as provided from charge pump 114, to a lower level voltage configured to verify that the flash cells are programmed correctly. Preferably, decoder 118 is configured to facilitate the selection of particular flash memory cells to be programmed or verified. In accordance with a preferred embodiment, to facilitate the verification process, program verify counter 122 is provided to set a limit to the number of times state machine 102 will attempt to verify and reprogram a particular flash memory cell. Byte counter 124 is provided to facilitate the selection of the particular flash memory cell within flash memory array 130 to be verified.

In general, the operation of state machine 102 and the various circuit blocks described above enables microcontroller 150 to accomplish various other controlling tasks while the state machine 102 programs the flash memory. In accordance with the present invention, microcontroller 150 may generate a start program signal to state machine 102. Accordingly, upon receiving the start signal, clock 104 will begin to cycle at a desired clock frequency to allow state machine 102 to program the flash memory. Moreover, once clock 104 has been initiated, preferably charge pump 114 will generate a high voltage for programming the flash memory cells, state machine 102 will apply the high voltage to the flash cells, as determined by decoder 118, whereupon high voltage regulator 116 reduces the voltage level to facilitate the verification of the programmed flash memory cells. Preferably, the length of time for generating the high voltage with charge pump 114, for applying the high voltage to the flash cells, and for verifying the programming of the flash cells is facilitated by timer 106. Moreover, program verify counter 122 operates to limit the number of times state machine 102 verifies the contents of the flash cells. Preferably, byte counter 124 assists decoder 118 in determining which flash cells within flash memory array 130 are to be verified.

Now that a general description of state machine 102 as well as the various associated circuit blocks has been provided, an exemplary embodiment in accordance with the present invention will now be described in more detail. With continued reference to FIG. 2, a state machine 102 for programming flash memory is suitably configured to cooperate with a plurality of circuit blocks including clock 104, timer block 106 comprising a plurality of timers 108, 110 and 112, high voltage charge pump 114, high voltage regulator 116, decoder 118, program verify counter 122 and byte counter 124.

In accordance with this preferred embodiment, state machine 102 generally comprises a sequence controller configured to control the flash memory programming process. Accordingly, state machine 102 includes various input and output signals that interface with the various circuit blocks to facilitate the programming process.

With continuing reference to FIG. 2, clock 104 generally comprises an internal dedicated clock for controlling amount of time available for state machine 102 to program the flash memory cells 130. Preferably, clock 104 is not utilized as a system clock but is dedicated to providing the clock pulses utilized in controlling the timing of the program sequences; alternatively, programming time may be controlled by a system clock. To facilitate this controlling of the timing sequences, clock 104 provides a clock signal 104a to state machine 102 and to timer block 106. Moreover, clock 104 is configured to receive a plurality of input signals, including a program start (PGM_START) signal 101 that is preferably generated from the microcontroller 150, as will be described in greater detail below, and a program done (PGM_DONE) signal 104b which is preferably generated by state machine 102 upon completion of the programming of the flash cells.

In accordance with this preferred embodiment of the present invention, timer block 106 comprises a program setup timer 108, a program timer 110 and a program verify setup timer 112. Program setup timer 108 is suitably configured to control charge pump 114 during generation of the high voltage needed for programming the flash cells. Preferably, program setup timer 108 is configured to receive an input signal, e.g. program setup (PGM_SETUP) signal 108a, from state machine 102, and to output a signal, e.g. program setup timeout (PGM_TIMEOUT) 108b, to state machine 102. Program timer 110 is suitably configured to control the amount of time the high voltage is applied to the control gates of the flash cells during programming. Although this length of time is preferably configurable, the length of time is configured for the programming of a particular flash cell and then remains generally the same for the remaining cells to be programmed. As with timer 108, program timer 110 is configured to receive an input signal, e.g. program pulse (PGM_PULSE) 110a, from state machine 102 to begin the time for programming, and to provide an output signal, e.g. program timeout (PGM_TIMEOUT) 110b, to state machine 102 to indicate when the programming of the flash cell is complete. Finally, program verify setup timer 112 is preferably configured to facilitate the verification of the contents of the flash cells to ensure that the cells have been properly programmed by coordinating the operation of high voltage regulator 116 to reduce the voltage of charge pump 114. Preferably, program verify setup timer 112 is suitably configured to receive an input signal, e.g. program verify setup (PV_SETUP) 112a, from state machine 102 and to provide an output signal, e.g. program verify setup timeout (PVS_TIMEOUT) 112b, to state machine 102 upon completion of the verification setup process. Further, as indicated above, timers 108, 110 and 112 may also be configured to receive clock signal (CLK) 104a to synchronize the timing of the sequences for state machine 102.

Figure 7:
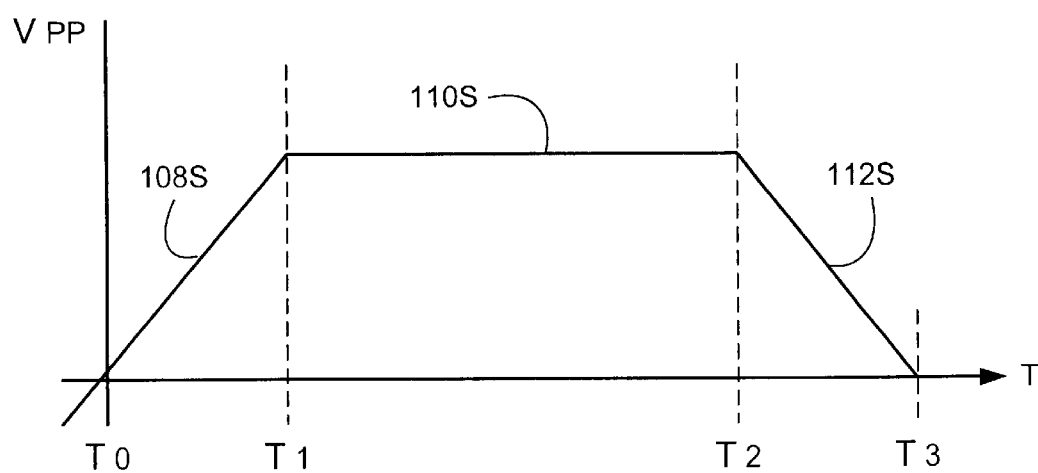
FIG. 7 is a timing diagram of the output voltage of the state machine as controlled by the setup, program and verify timers in accordance with the present invention.

With momentary reference to FIG. 7, the sequencing of timers 108, 110 and 112 is illustrated in more detail. As shown during segment 108s, the output voltage of charge pump 114 is ramped from a low value at time t0 to a high value at time t1, with time t1 indicating the start of the sequence for programming. This time needed for ramping to the high voltage is suitably controlled by program setup timer 108. After achieving the high value at time t1, the output voltage of charge pump 114 is maintained until time t2 to allow for the programming the flash memory cells. Accordingly, this programming time is suitably controlled by program timer 110. After the programming is complete and the flash cells are ready for verification, the output voltage of charge pump 114 is reduced by high voltage regulator 116 from the high value at t2 to a lower value at t3 so that the appropriate flash cells may be verified. Accordingly, the time for reducing the voltage in order to prepare for the verification process of the flash cells is suitably controlled by program verify setup timer 112.

With continued reference to FIG. 2, high voltage charge pump 114 is configured to generate the high voltage utilized for programming the flash cells. Preferably, charge pump 114 is configured to receive an input signal, e.g. program pulse (PGM_PULSE) 115, from state machine 102 to indicate when charge pump 114 should be generating high voltage outputs. Further, charge pump 114 provides an output voltage 114b to high voltage regulator 116 for eventual transmission to the flash memory. In accordance with a most preferred embodiment, charge pump 114 provides a plurality of output voltages 114b, including VPP, VPN, VPNE, VPPS and VPY.

In accordance with a preferred embodiment of the present invention, high voltage regulator 116 is configured to facilitate the verification of the contents of the flash memory after programming of the flash cells. More particularly, after programming the flash cells, state machine 102 verifies the contents of the programmed flash cells, most preferably every flash cell, to ensure that the programming sequence was correct and effective. In order to verify the contents of the flash cells, it is preferable for the output voltage of charge pump 114 to be reduced to a lower voltage so that the contents of the cells can be compared with the desired programming values. Accordingly, high voltage regulator 116 preferably acts as a voltage regulator to reduce the output voltage to a lower level to facilitate this comparison and verification process. In addition, high voltage regulator 116 is configured to receive an input signal, e.g. program verify (PGM_VERIFY) 116a, from state machine 102 to indicate when to initiate the process of regulating the output voltage of charge pump 114 and preferably provides an output signal 116b to decoder 118 to be transferred to the flash cells.

Decoder 118 is suitably configured to select the particular flash cells to be programmed as well as to verify and read the contents of the flash cells after programming. In accordance with a particularly preferred embodiment, before flash memory programming occurs, microprocessor 150 specifies the addresses or locations in the flash memory that should be programmed. Preferably, this specification process occurs by an output of system RAM 155 or microcontroller 150 to flash memory array 130 wherein the data and addresses or locations are delivered to the flash memory and then latched. Once the appropriate data and addresses are latched in the flash memory, decoder 118 selects the appropriate cells and applies the high voltage to the gates of the selected flash cells to be programmed. Preferably, this loading of the flash cells is a parallel load wherein the voltage values are simultaneously loaded into the selected flash cells. Alternatively, this loading may occur serially wherein each flash cell is loaded in sequence. Typically, the flash memory consists of four blocks of memory, with each block having a 1 k by 1 k dimension, or 1 megabit of memory, and thus a total memory size of 4 megabits (although any size flash memory may be employed). Accordingly, decoder 118 preferably selects the appropriate row in flash memory array 130 to be programmed.

Decoder 118 is also suitably configured to facilitate the verification and reading of flash cell values. In accordance with the preferred embodiment, decoder 118 suitably selects the previously programmed flash cells and reads the data in those flash cells. Accordingly, once decoder 118 reads those data values, state machine 102 can compare and verify the data read from the flash memory to the data that the microprocessor had intended to be programmed in the flash memory. Preferably, the read and verification process is conducted serially by decoder 118.

Program verify counter 122 is suitably configured to limit the number of times state machine 102 will perform the verification of the contents of the programmed flash memory cells. As discussed above, after state machine 102 has provided, through decoder 118, as parallel load of data to the previously latched flash cells, a verification of the contents is preferably conducted. As will be discussed in greater detail below, if the verification of the contents of the flash cell indicates that the programming sequence was unsuccessful, e.g., the contents of the programmed flash cell do not match in comparison to the desired data to have been programmed in the flash cell, state machine 102 will reprogram the flash cells that are in error and will then conduct a verification of the data in the reprogrammed flash cells. If this reprogramming process is again unsuccessful, this reprogram and verification process will be repeated until successful or until a verification limit is reached. Accordingly, program verify counter 122 suitably provides the limit to the number of times this verification process will occur. In accordance with the preferred embodiment, this limit is readily configurable up to 1000 verification attempts or more. Although this verification limit may be field configurable, the limit is preferably stored in the microprocessor 150 or state machine 102. Further, although this limit is variable, the limit is preferably set at a fixed limit, such as, for example, 64 verifications per programming sequence.

Byte counter 124, as will be described below, is also suitably configured to facilitate the verification process. As stated above, the verification process is preferably conducted serially, e.g., one cell at a time. Accordingly, after a particular flash cell is verified, byte counter 124 is configured to designate the next particular flash cell location to be verified, preferably by incrementing an internal counter so that decoder 118 can select the appropriate cell.

Figure 3:
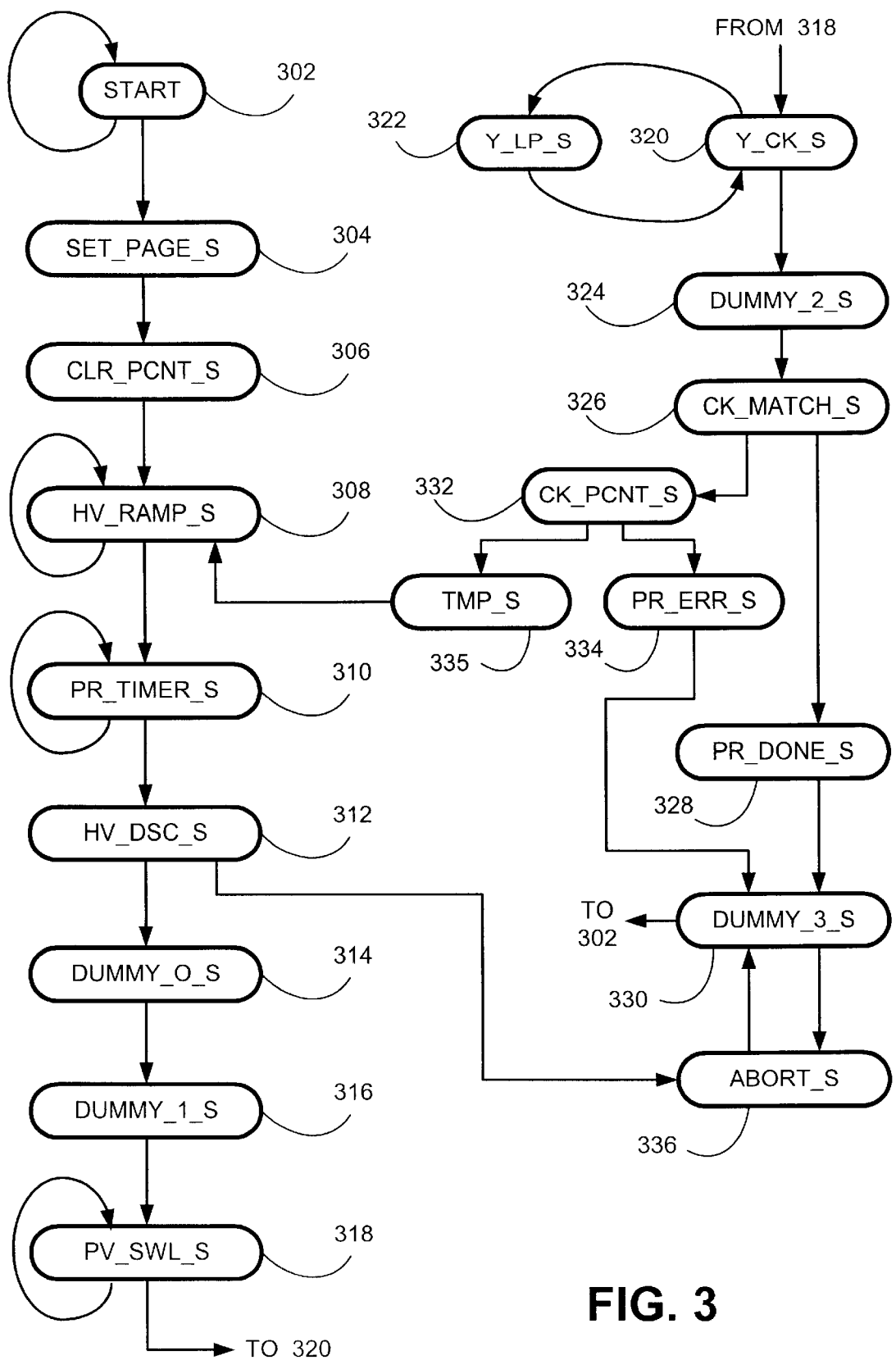
FIG. 3 is a state diagram of an exemplary process for programming flash memory in accordance with the present invention.

Now that a detailed explanation of a preferred embodiment of the present invention for programming flash cells has been described, a more thorough description of the operation of state machine 102 will be provided. To facilitate a better understanding of the operation, a program state diagram is shown in FIG. 3 and is described hereinbelow.

The state machine diagram is, in general, a logical flow chart of the programming code that is resident in state machine 102. In accordance with the present invention, the programming code may comprise any of the various high-level languages such as, for example, HDL (Hardware Discretion Language) code. In a preferred embodiment the code is comprised of VHDL code. Further, state machine 102 as well as its associated circuit blocks are suitably generated by a synthesizer component such as, for example, the Synopsys Design Compiler, provided by Synopsys of Mountain View, Calif. In general, the synthesizer allows designers to design components (e.g., an IC chip) for a high level language, such as HDL, and utilizes a microprocessor to synthesize or convert the design into physical gates that are implemented on the IC chip. However, as discussed above, the hardware components can be generated and realized by any number of hardware components configured to perform the specified functions without departing from the scope of the invention.

Figure 4:
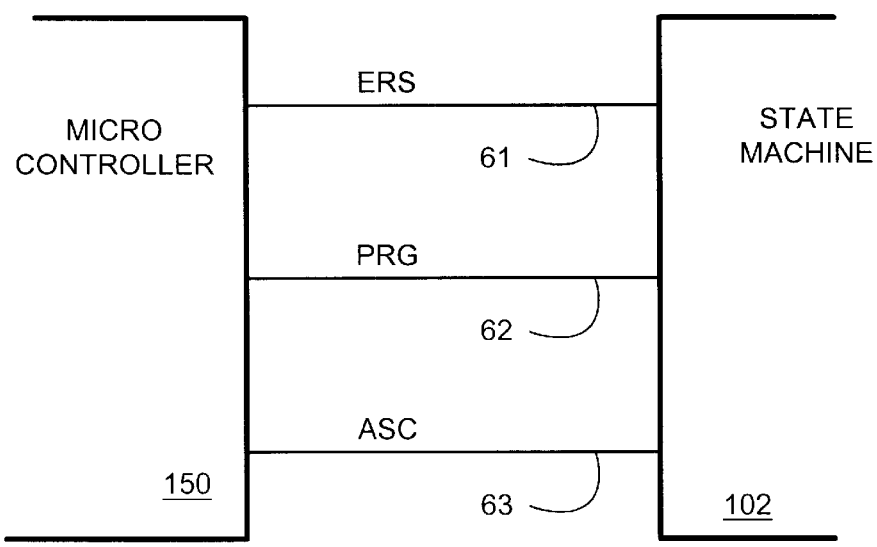
FIG. 4 is a block diagram of the various output signals of the microcontroller operatively coupled to the state machine in accordance with a preferred embodiment of the present invention.

As described above, microcontroller 150 provides various output signals to the flash chip 160 to facilitate the operation of state machine 102 within flash chip 160. With reference to at FIG. 4, output signals may comprise a program signal (PRG) 62 and a command strobe signal (ASC) 63. These output signals of microcontroller 150 initiate various internal signals of state machine 102 to control the programming operation. In addition, output signals may also comprise a done signal (DONE), an error signal (ERROR) and an abort signal (ABORT) in accordance with a preferred embodiment. To aid in the description of the interfacing and sequencing of output signals 62 and 63 to the various internal signals of state machine 102, a timing diagram is provided in FIG. 5. In accordance with a preferred embodiment of the present invention, PRG signal 62 is a command signal provided by microcontroller 150 to flash chip 130 to indicate that state machine 102 will be utilized for programming the flash cells. Further, ASC signal 63 is preferably a command strobe signal that indicates when the appropriate flash cells to be programmed by state machine 102 have been latched and stabilized. ASC signal 63 typically begins in a high state 63a. After the falling of PRG signal 62, ASC signal 63 will fall to a low signal 63b. Preferably, during this low signal state 63b, microcontroller 150 is latching the flash cell memory locations or addresses to be programmed by state machine 102. Low signal state 63b is suitably available for sufficient time to allow for all of the addresses of flash cells to be programmed to be latched and stabilized. Preferably, low state 63b is available for in the range of 5–15 nanoseconds, and most preferably for 12 nanoseconds to allow for the latching of the flash memory addresses by microcontroller 150 to occur. Upon completion of the latching and stabilizing sequences, ASC signal 63 returns to a high state 63a. During this return to high state 63a, i.e., the rising edge of ASC signal 63, a signal PGMX 101 is generated in flash chip 130 that initiates state machine 102 and clock 104. Preferably, PGMX 101 is generated by a one-shot signal, phi_pgnx 63c, that is preferably generated by the rising edge of ASC signal 63. Further, the rising edge of ASC 63 may generate an enable clock signal 63d that facilitates the initializing of clock 104.

In accordance with the present invention, due to the interaction of the various internal and external signals between microcontroller 150 and flash chip 160, state machine 102 is suitably configured to handle asynchronicity of the above signals while limiting the introduction of timing hazards. Asynchronous operation may be conveniently accommodated by providing a tight "handshaking" mechanism with the surrounding circuit blocks to ensure that the functional sequences described below are properly executed and chronologically coordinated, as needed.

With reference to FIGS. 2 and 3, in accordance with the present invention, state machine 102 suitably begins in a START state 302 which initiates the process for programming flash memory 130 by state machine 102. In this state, internal PGMX signal 101 is read by state machine 102; if PGMX signal 101 is high, i.e., PGMX=1, the program sequence is initiated and state machine 102 proceeds to state 304; if on the other hand PGMX signal 101 is low, i.e., PGMX=0, then state machine 102 will remain in state 302 until PGMX signal 101 is triggered high by one-shot signal 63c (described in conjunction with FIG. 5).

In state 304, SET PAGE, initialization of state machine 102 occurs. During state 304, the general logic states of various components of state machine 102 are initialized to an initial state, such as, for example, the initializing of program verify counter 122. Preferably, a reset signal, ST RESET 304a, is generated as an output signal from state machine 102 to reset the logic of various functional components and signals, such as, for example, high charge pump 114, program verify setup signal 112a or other like functional blocks and signals. After generation of ST RESET 304a, during a CLEAR PULSE COUNTER state 306, program verify counter 122 is preferably reset or cleared.

Figure 5:
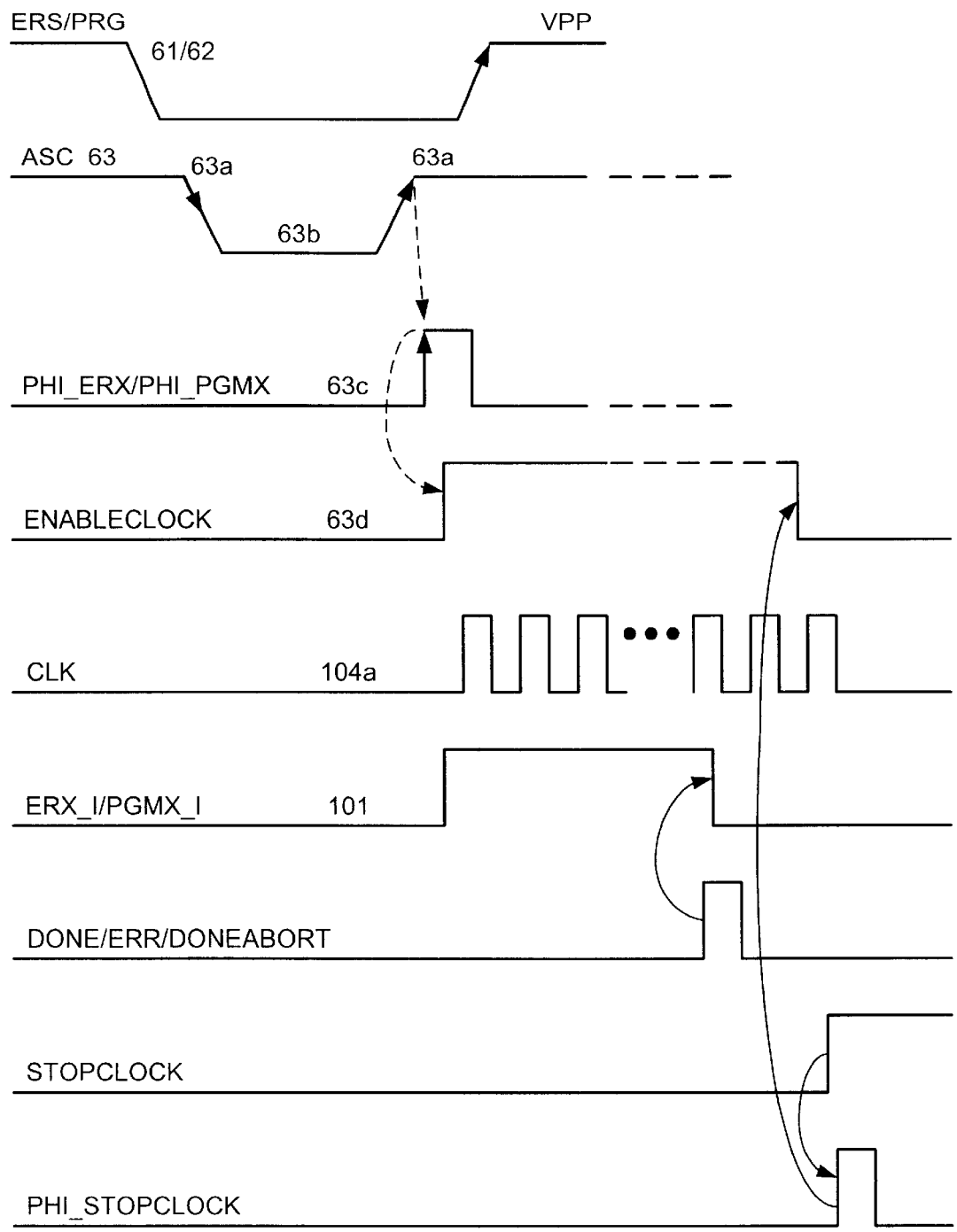
FIG. 5 is a timing diagram of various internal signals of the state machine in accordance with the present invention.

Next, state machine 102 proceeds to high voltage ramp state, HV_RAMP 308, for generation of high voltage for programming of the flash cells. In state 308, a program high voltage enable signal, PHVEN 308a, is generated as an output signal from state machine 102 to trigger program setup signal (PGM_SETUP) 108a. As discussed above, program setup signal 108a initiates program setup block 108. Upon initialization, program setup block 108 begins counting clock pulses of clock 104, as shown in FIG. 5, until a predetermined number of clock pulses has been reached. In accordance with the present invention, the predetermined number of clock pulses counted by program setup block 108 is based on the time needed for high voltage charge pump 114 to ramp up to the desired high voltage level utilized for programming and is suitably in the range of 20 to 60 clock cycles, and more preferably between 30 to 40 clock cycles. Upon reaching the predetermined number of clock pulses, an output signal 311, TIMERREQ, is generated by state machine 102, and state machine 102 proceeds to state 310 to begin the programming of the flash cells. Alternatively, rather than counting clock pulses in program setup timer 108, in accordance with one aspect of the present invention state machine 102 may monitor the high voltage produced by high voltage charge pump 114 to determine when the appropriate high voltage level has been reached before proceeding to state 310. Upon reaching the appropriate high voltage level, an internal signal, PHV_REACH 308a, is changed to a high state, i.e., PHV_REACH=1, and state machine 102 proceeds to state 310 to begin the programming of the flash cells.

In program timer state PR_TIMER 310, the programming of the flash cells occurs. Here, program timer 110 is initialized and high voltage signals are applied to the flash cells previously latched by microcontroller 150. As discussed above, the application of the high voltage to the flash cells generally occurs by a parallel load of decoder 118 onto the latched cells and thus facilitates the transition of the latched cell addresses to a high logic state. Typically, this parallel load occurs during 64 pulses of program timer 110. Preferably, the clock frequency of clock 104 is reduced to a slower frequency during this programming state, such as, for example in the range of 0.3–0.5 megahertz (and particularly about 0.3906 MHZ), a pulse every 2.56 microsec, from a normal clock frequency of about 6 to 9 MHZ (and most particularly about 8.33 MHZ). This slower frequency for clock 104 may be conveniently triggered by an output signal, EHV enable 110c, output by state machine 102 to clock 104 which triggers clock 104 to reduce its frequency. Preferably, the frequency adjustment of clock 104 is facilitated by controlling the operation of a ring oscillator. Once program timer 110 has counted the predetermined number of pulses, e.g., 64 clock pulses, an internal signal, TIMEROUT is set high, i.e., TIMEROUT=1, and an output signal (e.g. program timeoutsignal PGM_TIMEOUT) 110b is generated by program timer 110 and sent to state machine 102 to indicate that the latched cells have been programmed to a high logic state.

Next, in high voltage discharge state (HV_DISC_S) 312, an output signal, e.g. high voltage discharge signal 312a, is generated by state machine 102 and applied to charge pump 114. In accordance with the present invention, charge pump 114 reduces the voltage to a lower a level, i.e., the voltage is discharged to a low value state. Preferably, clock 104 is operating at a a slower frequency, such as described above in state 310. Accordingly, the discharging of the high voltage by charge pump 114 may be facilitated during a small number (e.g., one) of clock cycles.

Upon discharging of the high voltage by charge pump 114 during state 312, program verify signal (PGM_VERIFY) 116a (also shown as PVERX 312b on FIG. 3) is generated by state machine 102 and applied to high voltage regulator 116. High voltage regulator 116 is configured to regulate and switch the voltage level as reduced by charge pump 114 to a desired voltage level to be utilized for verification of the flash memory cells. Accordingly, high voltage regulator 116 includes a voltage regulator to provide the desired voltage level to be applied by decoder 118 during verification. In accordance with a particularly preferred embodiment, a dummy zero state 314, i.e., an additional timing pulse, may be utilized by state machine 102 to facilitate the control of the timing synchronization during program verification.

Figure 6:
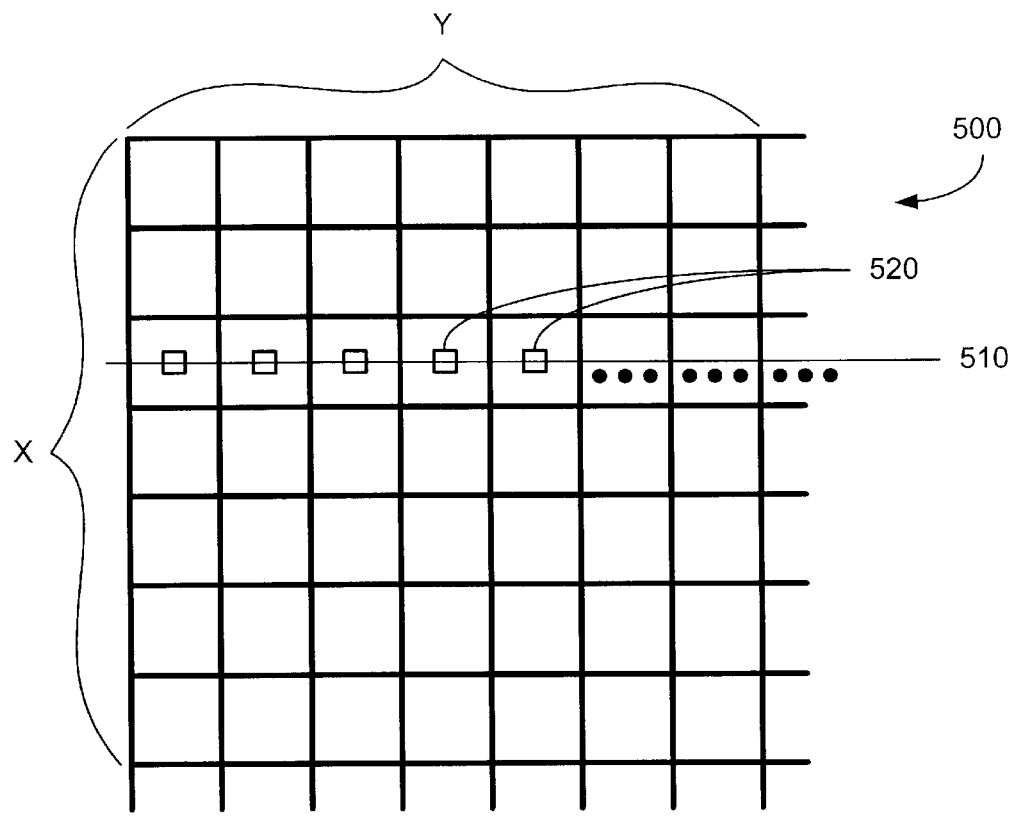
FIG. 6 is a schematic diagram of an array of flash memory cells in accordance with the present invention.

With reference now to FIG. 6, an array 500 of flash memory cells is shown. In the array, the various columns of cells are identified by Y address locations while the rows of cells are identified by X address locations. Alternatively, X address locations may be described as a wordline 510. Wordline 510 is preferably designated or selected in state 302 by microcontroller 150 and transmitted to state machine 102. Thus, to change or select another wordline 510, a program command signal (PGM) 62 is generally required from microprocessor 150 i.e., only one wordline 510 is programmed and verified during a single iteration of the state diagram. Accordingly, wordline 510 is identified by decoder 118 to facilitate the selection of the X address location, during program verification. Alternatively, during program verify, flash cells 520 are verified column by column for the particular wordline 510 selected; thus, preferably, one flash cell 520 is verified at a time.

Upon the completion of state 312 or, alternatively, of dummy state 314, a clear Y Address output signal (CLR__YADDR) 314a, for example the previously described clear byte count signal (CLR__BYTE__CNT) 124a, is generated by state machine 102. Accordingly, during dummy 1 state 316, the Y address location is cleared, i.e., the internal byte counter is set to zero in block 124. This allows state machine 102 and decoder 118 to verify the contents of each flash cell by beginning with an initial column and then verifying each flash cell on a.column by column basis until all of the flash cells are verified for wordline 510.

After the Y address is cleared in state 316, state machine 102 preferably proceeds to program verify setup wordline state (PV__SWLS) 318. During state 318, an output signal, e.g. program verify setup signal (PV__SETUP) 112a, is generated by state machine 102 and sent to program setup timer block 112. Timer block 112 is configured to allow time for the voltage regulator of high voltage regulator 116 to stabilize the voltage in a low voltage state as utilized during program verify. As long as an internal signal (e.g. TIMEROUT 318a) is in a low state, i.e., TIMEROUT=0, then program verify setup wordline state 318 will continue to allow the voltage to be stabilized and regulated by high voltage regulator 116 until the voltage reaches a value VG ranging from 2.0 to 2.5 volts, and most preferably at 2.2 volts. Once timer 112 reaches a predetermined amount of clock pulses configured to permit high voltage regulator 116 to reach value VG, signal 318a will switch to a high state, i.e., TIMEROUT=1, and state machine 102 will preferably transition to state 320. Alternatively, to determine when value VG has been obtained, state machine 102 may monitor the voltage level within high voltage regulator 116 until value VG is reached rather than utilizing timer 112 to count clock pulses. Once value VG has been reached, state machine 102 is ready to proceed to the verification stage of the programming process.

In accordance with a further aspect of the present invention and referring again to FIG. 6, a flash memory array 500 is shown. As discussed above, wordline 510 preferably represents the selected row of flash cells to be programmed. In a preferred embodiment wordline 510 is comprised of 32 columns, with the intersection of each column with wordline 510 defining a byte 520. Moreover, in accordance with the present invention, each byte 520 is preferably comprised of 16 bits, i.e. 16 flash cells. Accordingly, during the program loading of state machine 102, the high voltage values are preferably loaded onto wordline 510 in one step (parallel loading). However, during verification by state machine 102, one byte 520 is advantageously verified at a time, i.e. 16 cells at a time. It will be appreciated, however, that the present invention may be employed in the context of virtually any two (or greater) dimensional array of any size, and that writing (programming), verifying, and erasing the flash cells may be implemented in any combination of serial and parallel techniques.

Continuing with FIG. 3, upon reaching the low value VG utilized for verification of the flash memory cells, state machine 102 preferably proceeds to Y check state (Y__CK__S) 320. In Y check state 320, state machine 102 selects the particular byte 520 to be verified, reads the value of the programmed cell (or cells) for the selected byte 520, and compares the read value with the value which was to have been programmed. Preferably, the comparison is conducted by a comparison device (e.g. a comparator) in flash chip 160, although the data verification could occur elsewhere (e.g. in controller 150). As each cell is verified or checked for selected byte 520, the latch is preferably reset for each cell if correctly programmed. After the selected byte 520 is checked, state machine 102 determines if all bytes 520, i.e., Y column addresses, have been checked. Preferably, state machine 102 utilizes an internal signal , LAST ADDR 320b, to determine whether all bytes 520 have been verified for the then current wordline 510. If all bytes 520 have been verified, i.e., byte counter 124 has reached a predetermined limit representing the total number of bytes 520 in wordline 510, then LAST ADDR signal 320b is set high, i.e., LAST ADDR=1. If all bytes 520 have not been verified, state machine preferably proceeds to state (Y__LP__S) 322 and provides an output, e.g. increase byte counter signal 124b, to increment the Y column address and proceed to the next byte 520. After incrementing to the next byte 520, state machine 102 reads the values of each cell for the selected byte 520 and compares the read value to the desired program value. Again, if the cells are correctly programmed, the respective latches corresponding to the correctly programmed cells are reset; otherwise, an incorrectly programmed cell will remain latched. After verifying each cell in the current byte 520, if any remaining bytes 520 have not been verified for wordline 510, state machine 102 proceeds to state 322 and increments to the next Y column address. If, on the other hand, all bytes 520 have been checked for the current wordline 510, i.e., LAST ADDR=1, state machine 102 generates an output signal, last Y address (LAST__ADDR) 124c, and proceeds to the next state, preferably dummy state 324, to facilitate timing synchronization.

After timing synchronization state 324, state machine 102 proceeds to check match state (CK__MATCH__S) 326. During check match state 326, state machine 102 utilizes the aforementioned comparison device of flash chip 130 to determine whether all bytes 520 have been correctly programmed. If all bytes 520, and thus flash cells, have been correctly programmed, state machine proceeds to state 328, program done state (PR__DONE). After reaching program done state 328, state machine 102 preferably proceeds to dummy state 330 wherein clock 104 is stopped before proceeding to START state 302 to await the next command signal from microcontroller 150.

If any byte 520 was incorrectly programmed, state machine proceeds to check pulse count state (CK__PCNT__S) 332 to check the pulse counter, i.e. program maximum counter 122. During state 332, state machine 102 preferably generates an output, e.g. increase program counter (INC__PGM__CNT) signal 122b, and program maximum counter 122 is incremented. If program maximum counter 122 has exceeded a predetermined limit, e.g. 64 attempts at programming the flash cells correctly, state machine 102 proceeds to program error state (PR__ERR__S) 334. Upon reaching program error state 334, state machine 102 outputs an error signal (ERROR) 104c to microcontroller 150 to indicate that the desired programming function was not completed. After outputting error signal 104c, state machine 102 preferably proceeds to dummy state 330 for timing synchronization, i.e. stop the operation of clock 104, before proceeding to START state 302 to await the next start command signal from microcontroller 150. If, on the other hand, program maximum counter 122 has not reached the predetermined limit, state machine 102 preferably proceeds to temporary state (TMP_S) 335 and awaits for a signal, such as, for example, PHV enable 308a, and then preferably repeats state 308 by recharging high voltage charge pump.

Accordingly, if program maximum counter 122 has not reached the predetermined limit, state machine 102 will enter the program and verify sequences of states 310 through 326. However, unlike the initial programming and verification sequences, state machine 102 will preferably reprogram only those flash cells that are still latched, i.e., those that were not programmed correctly on the first sequence. Stated another way, state machine 102 preferably reapplies the high voltage signal to a subset of the flash cells identified during the verifying step as embodying a programming failure. In this regard, it will be appreciated that reprogramming flash cells that were correctly programmed on the first sequence (or in any subsequent sequence) is unnecessary, and may eventually impede the ability to program those flash cells.

Figure 10:
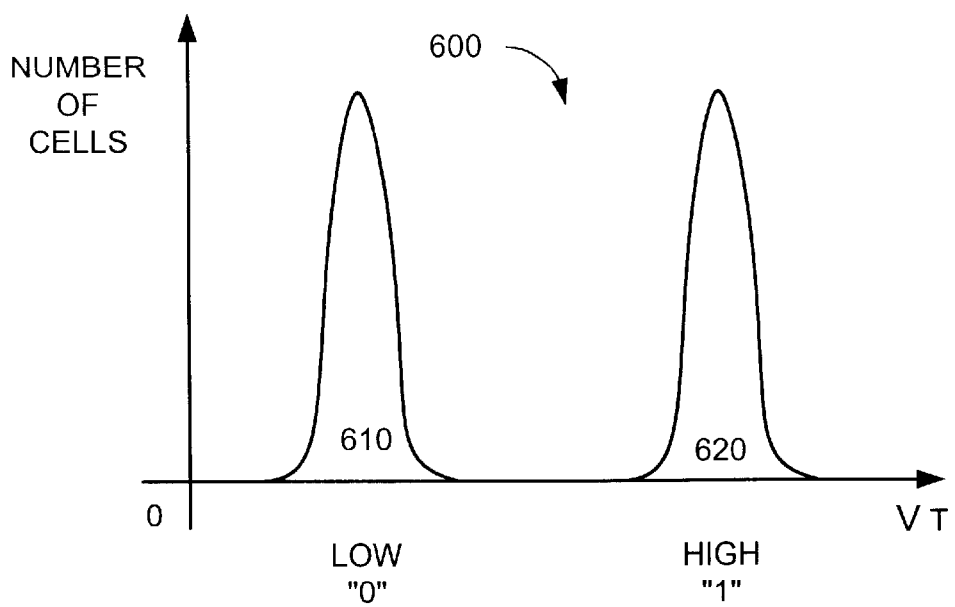
FIG. 10 is a timing diagram of the distribution of the flash cells as a function of voltage Vt in accordance with the present invention.

With reference to FIG. 10, the distribution of the flash cells as a function of voltage Vt is shown. Preferably, flash cells should be distributed between a low range 610, Vt=0, and a high range 620, i.e., Vt=1. Due to the continuous programming and reprogramming of flash cells during the life of the flash memory, the flash cells will have a tendency to drift from a low range 610 to the left of the voltage Vt. Stated another way, the threshold level for a flash cell tends to drift as a function of the number of cycles of programming. As a result, many flash cells may have a low range below zero, thereby compromising the extent to which microcontroller 150 can effectively control the gate voltages of those flash cells, and thus the ability to program the flash cells from a low state to a high state during programming. Accordingly, during a most preferred embodiment of the present invention, when state machine 102 reprograms flash cells after receiving a signal from check match state (CK_MATCH_S) 326, only those flash cells that were incorrectly programmed will be reprogrammed on the second or any subsequent programming cycle. Consequently, the ability to program the flash cells will be extended over the current program methodologies known for programming flash memory.

Although the normal operation of the programming cycle for state machine 102 has been described in detail, including the programming error state (PR_ERROR_S) 334, in accordance with a preferred embodiment of the present invention, state machine 102 may utilize an abort state (ABORT) 336 to terminate the current programming cycle. In accordance with this aspect of the invention, state machine 102 contains an internal abort signal 336a, ABORT, that is monitored during the programming cycle. As long as ABORT signal 336a is low, i.e. ABORT=0, then state machine 102 will continue with the current programming cycle. However, if during the course of programming ABORT signal 336a goes to a high state, i.e., ABORT=1, state machine will depart the current programming state and proceed to abort state 336. In accordance with the present invention, ABORT signal 336 is most preferably monitored during the programming states 308 through 312. However, it will be appreciated that ABORT signal 336 may be effectively monitored during the verification states 314 through 334 as well. Moreover, ABORT signal 336 may be triggered by a plurality of circumstances, such as, for example, a signal from the microcontroller 150 as a result of a power failure or another internal error signal, a user request, or from flash chip 130 as a result from internal diagnostic failures, i.e., not communicating with microcontroller 150.

Having now described in detail the various circuit blocks and components of state machine 102 during programming, as well as the operation of the components with state machine 102 in accordance with exemplary embodiments of the present invention, an explanation of the various circuit blocks and state machine for erasing the memory of the flash cells will now be described. Although the process of programming the flash memory was first described above, in general it is preferable to erase the flash memory before programming.

Figure 8:
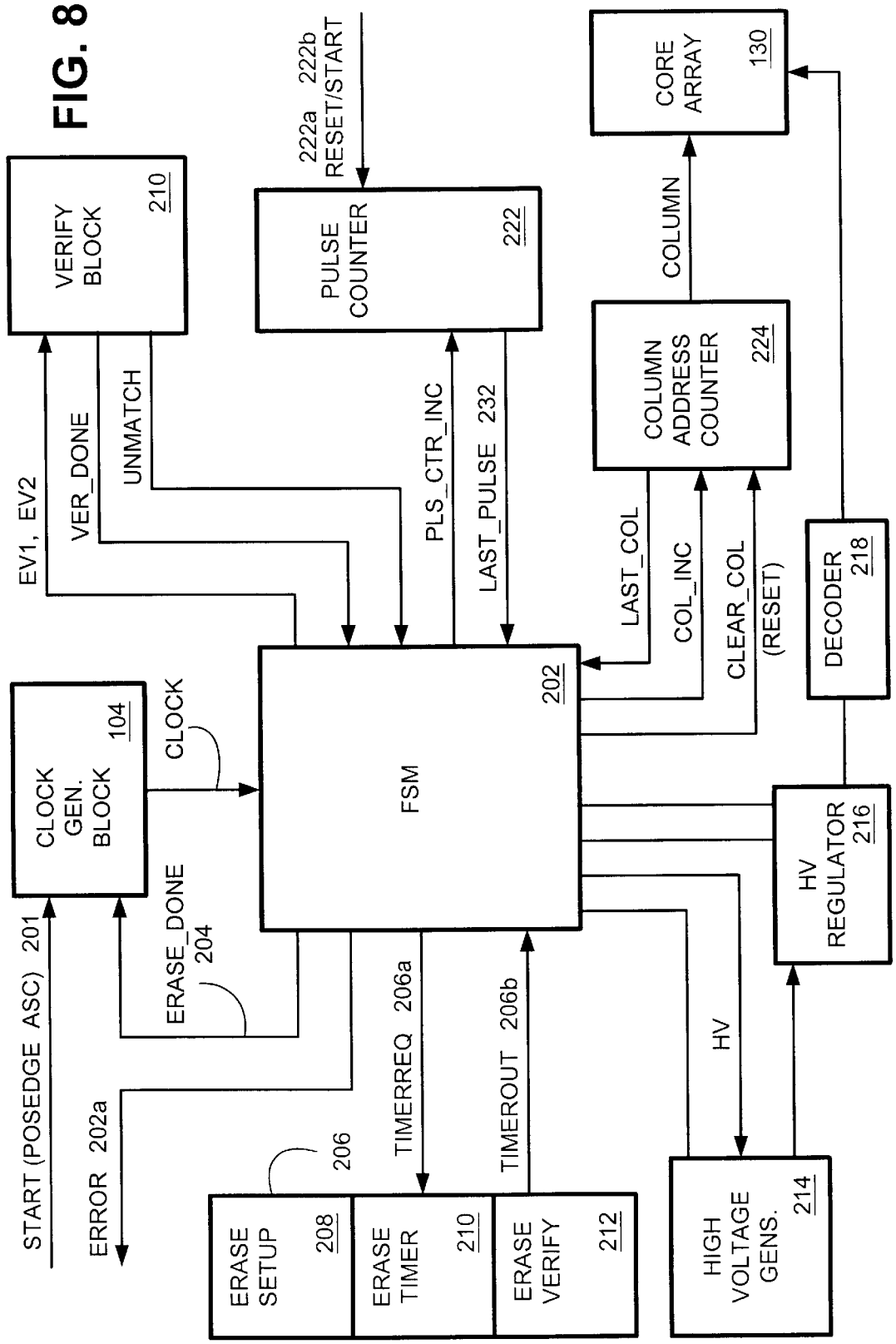
FIG. 8 is a schematic representation of an exemplary state machine for erasing flash memory.

Referring now to FIG. 8, the erase function is initialized by a command signal from microcontroller 150 prior to programming of the flash memory. Thus, in accordance with a preferred exemplary embodiment of the present invention, a state machine utilized for programming and erasing memory will now be described. In accordance with this aspect of the invention, state machine 202 suitably comprises various functional blocks including a clock 104, a timer 206, a high voltage generator 214, a high voltage regulator 216, a decoder 218, a pulse counter 222, and a column address counter 224. State machine 202 is configured to provide a sequence controller for programming and erasing the flash memory, typically utilizing the various circuits described above. Preferably, state machine 202 is comprised of the same hardware as state machine 102, which is utilized for programming flash memory, as described above. Alternatively, state machine 202 may comprise different hardware, and may be created in the same manner as the hardware for state machine 102, i.e., with a synthesizer or other device.

In accordance with the present invention, clock 104 is generally a dedicated clock for state machine 202 and is configured to provide the clock pulses utilized in the sequencing of the various operations. Moreover, clock 104 may be configured to operate at different frequencies during the sequence of operations. In accordance with the illustrated embodiment of the present invention, clock 104 may be the same clock utilized in programming functions or, alternatively, a separate clock. Timer 206 is configured to control the amount of time of different sequences or functions of state machine 202 (i.e., the duration of respective timing windows associated with erasing sequences) during erasing of the flash memory, including high voltage generation, program verification and the selection of flash cells to be erased. High voltage generator 214 is configured to generate a high voltage output for the state machine 202 when erasing the contents of the flash memory cells. High voltage regulator 216 is configured to change or switch the high voltage level of the flash memory cells, as provided from generator 214, to a lower level voltage to verify that the flash cells are erased completely. Decoder 218 is configured to facilitate the selection of particular flash memory cells to be erased or verified. To facilitate the verification process, erase pulse counter 222 is preferably configured to set a limit to the number of times state machine 202 will attempt to verify and erase a particular flash memory cell; column address counter 224 is preferably configured to facilitate the selection of the particular flash memory cell to be verified.

In general, the operation of state machine 202 and the various circuit blocks described above enables microcontroller 150 to accomplish various other control tasks while state machine 202 erases the flash memory. In accordance with the present invention, microcontroller 150 will generate a start erase signal, such as, for example, ERS signal 61 shown on FIG. 5, and deliver the signal to state machine 202. Upon receiving the signal, clock 104 begins cycling at a desired clock frequency to allow state machine 202 to erase the contents of the flash memory. Accordingly, generator 214 will preferably generate a high voltage for erasing the flash memory cells, state machine 202 suitably applies the high voltage to the flash cells, preferably as selected by decoder 218, and then high voltage regulator 216 suitably reduces the voltage level to facilitate the verification of the erased contents of the flash memory cells. Although generator 214 and high voltage regulator 216 are comparable to charge pump 114 and high voltage regulator 116 as utilized during programming functions of state machine 102, the voltage values for erase blocks 214 and 216 are logically different than their counterpart programming components. In other words, erase components 214 and 216 are comprised of similar hardware but generate and output signals for a different purpose. Preferably, the length of time for generating the high voltage with generator 214, for applying the high voltage to the flash cells, and for verifying the erasing of the contents of the flash cells is facilitated by timer 206. Moreover, erase pulse counter 222 preferably operates to limit the amount of times state machine 202 verifies the contents of the flash cells and column address counter 224 suitably assists decoder 218 in determining which flash cells are to be verified.

Now that a general description of state machine 202 as well as the accompanying various circuit blocks has been provided, an exemplary embodiment in accordance with the present invention will now be described in more detail. With reference to FIG. 8, a state machine 202 for erasing flash memory preferably cooperates with a plurality of logical blocks or circuits including clock 104, timer block 206 comprising a plurality of timers 208, 210 and 212, high voltage generator 214, high voltage regulator 216, decoder 218, erase pulse counter 222 and an column address counter 224.

In accordance with this preferred embodiment state machine 202 generally comprises a sequence controller configured to control the flash memory erasing process. Accordingly, state machine 202 includes various input and output signals that interface with the various circuit blocks to facilitate the erasing process.

With continuing reference to FIG. 8, clock 104 generally comprises an internal dedicated clock for state machine 202 to erase the contents of the flash memory cells 130. Preferably, clock 104 is not utilized as a system clock but is dedicated to providing the clock pulses utilized in controlling the timing of the erase sequences; alternatively, clock 104 may take a signal from a system clock. To facilitate this controlling of the timing sequences, clock 104 provides a clock signal 104a to state machine 202 and to timer block 206. Moreover, clock 104 is suitably configured to receive a plurality of input signals, including an erase start command signal (START) 201 generated by signals from the microcontroller, as will be described in greater detail below, and an erase done signal (ERASE_DONE) 204b which is preferably generated by state machine 202 upon completion of the erasing and verification of the contents of the flash cells memory.

In accordance with this preferred embodiment of the present invention, timer block 206 comprises an erase setup timer 208, an erase timer 210 and an erase verify setup timer 212. Erase setup timer 208 is suitably configured to control the timing of generator 214 during generation of the high voltage needed for erasing the flash cells. Preferably, erase setup timer 208 is configured to receive an input signal, TIMERREQ 206a, from state machine 202, and to produce an output signal, TIMEROUT signal 206b, to state machine 202. Erase timer 210 is suitably configured to control the amount of time to apply the high voltage to the flash cells during erasing of the flash cell memory contents. Although this length of time is readily configurable, preferably the length of time is configured for the erasing of the flash cells and then remains generally the same for the remaining cells to be erased. As with timer 208, erase timer 210 is configured to receive an input signal, e.g. TIMERREQ signal 206a, from state machine 202 to begin the time for erasing, and to provide an output signal, e.g. TIMEROUT signal 206b, to state machine 202 to indicate when the erasing of the flash cell is complete. Erase verify setup timer 212 is suitably configured to facilitate the verification of the contents of the flash cells to ensure that the cells have been properly erased by coordinating the operation of high voltage regulator 216 to reduce the voltage of generator 214. Accordingly, erase verify setup timer 212 is configured to receive an input signal, e.g. TMERREQ signal 206a, from state machine 202 and to provide an output signal, e.g. TIMEROUT signal 206b, to state machine 202 upon completion of the verification setup process. Further, as indicated above, preferably timers 208, 210 and 212 are also configured to receive a clock signal 104a to synchronize the timing of the sequences for state machine 202. Still further, as with their programming counterparts as described in FIG. 3, timers 208, 210 and 212 are suitably configured to control the time for ramping, maintaining and reducing the output voltage of generator during the setup, erasing and verification process.

With continued reference to FIG. 8, high voltage generator 214 is suitably configured to generate the high voltage utilized for programming the flash cells. Preferably, generator 214 is configured to receive an input signal, e.g. (HV) signal 215, from state machine 202 to indicate when generator 214 should be generating high voltage outputs. Further, generator 214 provides an output voltage 214b to high voltage regulator 216 for eventual transmission to the flash memory.

High voltage regulator 216 is configured to facilitate the verification of the contents of the flash memory after erasing of the contents of the flash cells. In accordance with a preferred embodiment of the present invention, after erasing the flash cells, state machine 202 verifies the contents of the erased flash cells, most preferably every flash cell, to ensure that the erasing sequence was complete. In order to verify the contents of the flash cells, it is preferable for the output voltage of generator 214 to be reduced to a lower voltage so that the contents of the cells can be evaluated to determine whether successfully erased. Accordingly, high voltage regulator 216 preferably acts as a voltage regulator to reduce the output voltage to a lower level to facilitate this evaluation and verification process. In addition, high voltage regulator 216 is preferably configured to receive an input signal, e.g. erase verify (ER_VERIFY) signal 216a, from state machine 202 to indicate when to begin the process of regulating and switching the output voltage and provides an output signal 216b to decoder 218 to be transferred to the appropriately designated flash cells.

Figure 11:
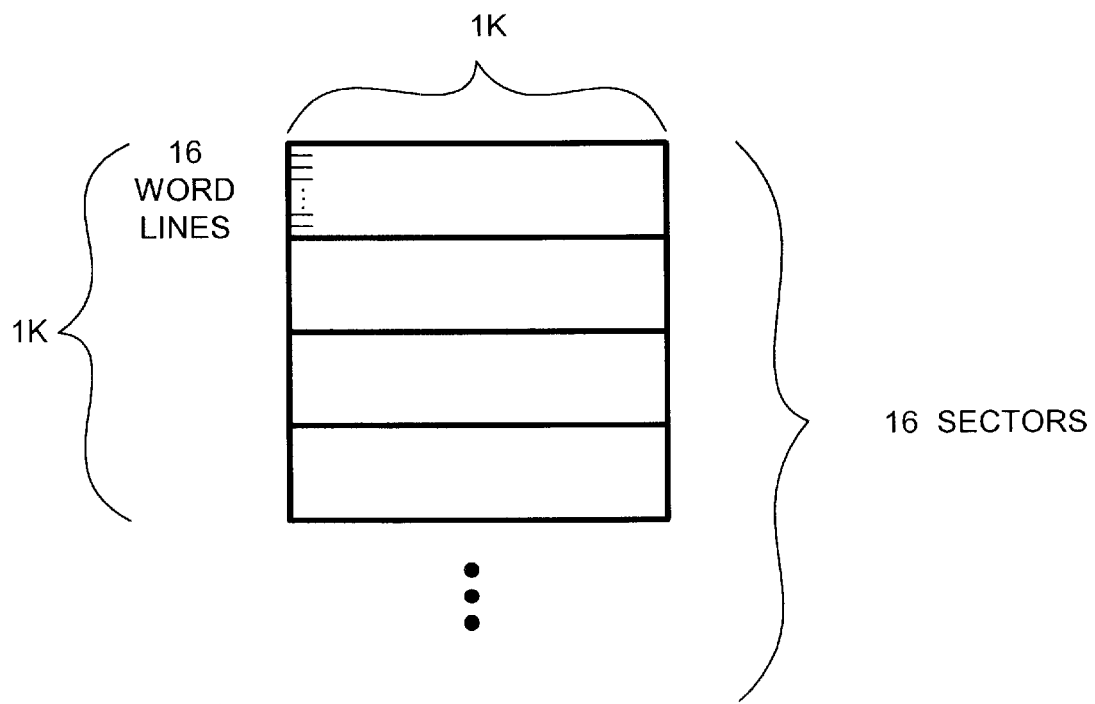
FIG. 11 is an alternate view of an array of flash memory in accordance with the present invention.

In accordance with a preferred exemplary embodiment of the present invention, decoder 218 is suitably configured to select the particular flash cells to be erased as well as to verify and read the contents of the flash cells after the erase function has been completed. In accordance with a particularly preferred embodiment, with reference to FIG. 11, flash memory array 130 comprises 16 sectors with each sector preferably comprising 64 rows or wordlines; alternatively, any 2 (or greater) dimensional array of any size can be employed in the context of this invention. During the erase function, unlike the programming function, state machine 202 will preferably erase the flash cell memory one sector at a time for each column, rather than a substantially simultaneous manner as the programming function. Decoder 218 is also suitably configured to facilitate the verification and reading of flash cell values. In accordance with a preferred embodiment, decoder 218 suitably selects those flash cells to be verified and reads the data in those flash cells. Accordingly, once decoder 218 reads those data values, state machine 202 can compare and verify the contents of the flash memory to a standard value which represents an erased flash cell, as will be described in more detail below.

Erase pulse counter 222 is suitably configured to limit the number of times state machine 202 will perform the erase verification of the contents of the flash memory cells. As discussed in greater detail below, if the verification of the contents of the flash cells indicates that the erasing sequence was unsuccessful for any given flash cell, e.g., the contents of the attempted erased flash cell do not match in comparison to a standard value that represents an erased flash memory cell, state machine 202 will not proceed to the next column, or to any of the remaining columns. Rather, state machine 202 will return to the beginning sequence of the erase function and perform the erase function for all of the flash memory cells. If a subsequent verification determines that the erase process is again unsuccessful, this re-erase and verification process will be repeated until successful or until a verification limit is reached. Accordingly, erase pulse counter 222 suitably provides the limit to the number of times this verification process will occur. In accordance with the preferred embodiment, this limit is readily configurable up to 1000 or more. Although this verification limit may be field configurable, the limit is preferably stored in the microprocessor 150 or state machine 202. Further, although this limit is variable, the limit is preferably set at constant value, such as, for example, 64 verifications per erasing sequence.

Column address counter 224, as will be described below, is also configured to facilitate the verification process. As stated above, the verification process is conducted one column at a time. Accordingly, after a particular column of flash cells is verified, column address counter 224 is configured to designate the next particular column of flash cells to be verified, preferably by incrementing a counter so that decoder 218 can select the appropriate column.

Now that a detailed explanation of a preferred embodiment of the present invention for erasing flash cells has been described, a more thorough description of the operation of state machine 202 will be provided. To facilitate a better understanding of the operation, a state diagram representing the logical flow chart of the erase sequences that are carried out by state machine 202 as well as the various components is shown in FIG. 13 and is described hereinbelow.

Figure 9:
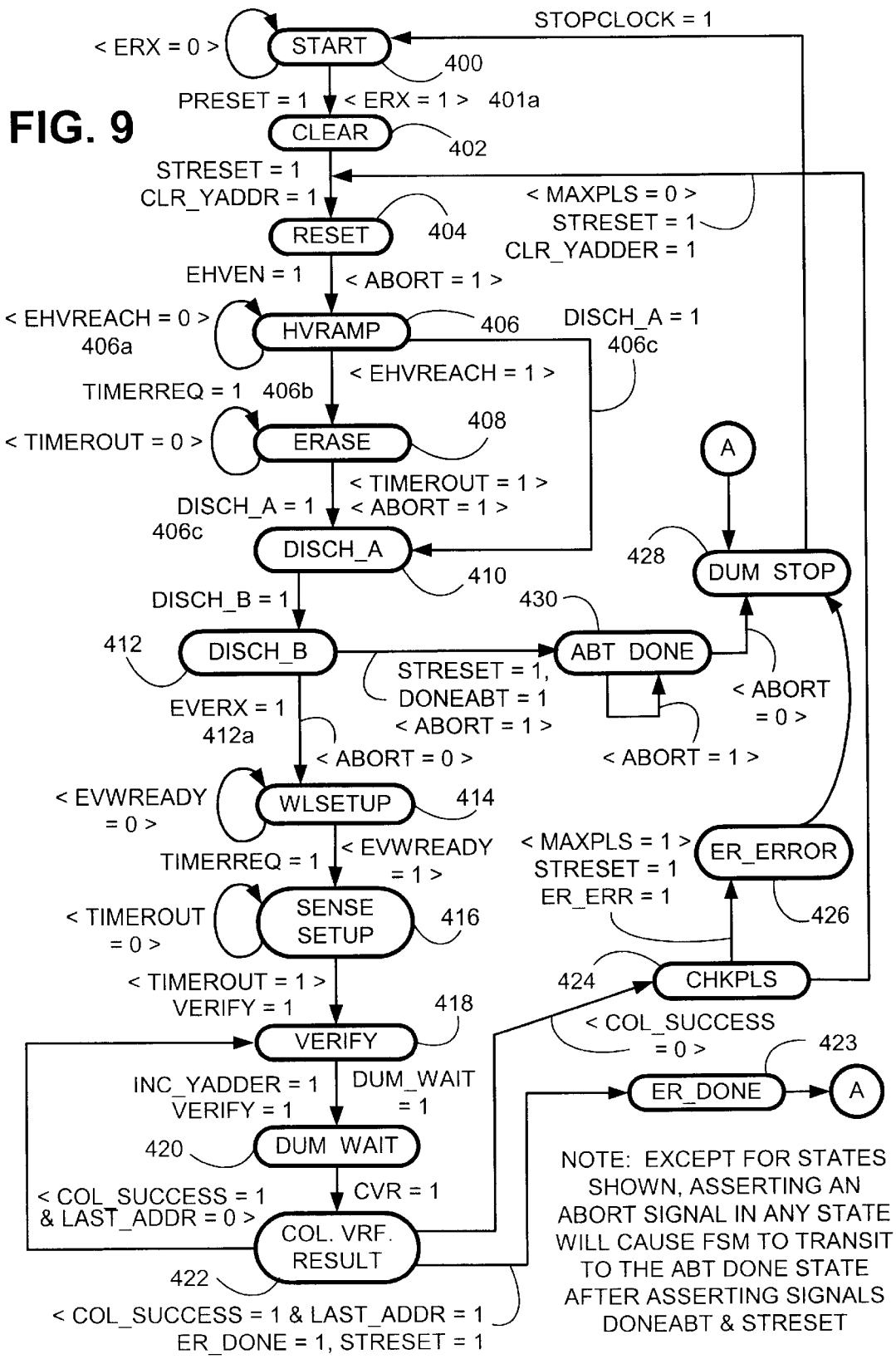
FIG. 9 is a state diagram of an exemplary process for erasing the flash memory in accordance with the present invention.

With reference to FIG. 9, in accordance with a preferred embodiment of the present invention, state machine 202 begins the erase function through the use of a START state 400 which initiates the process for erasing the flash memory by state machine 202. START state 400 is typically initiated by the triggering of an input signal, e.g. erx signal (erx) 401, by a one-shot signal, preferably phi_erx 63c. Accordingly, erx signal 401 is monitored and read by state machine 202; if erx signal 101 is high, i.e., erx=1, the erase start sequence is initiated and state machine 202 proceeds to state 402; if, on the other hand, erx signal 401 is low, i.e., erx=0, then state machine 202 will remain in state 400 until erx signal 401 is triggered high by one-shot signal phi_erx 63c.

In (CLEAR) state 402, pulse counter 222 is suitably reset or cleared. Preferably, pulse CO counter 222 receives an input signal, e.g. RESET signal 222a, to clear the current count of clock pulses; i.e. reset counter 222 to zero. Accordingly, after resetting pulse counter 222, state machine 202 preferably generates outputs, including STRESET 402a and CLR_YADDR 402b, and proceeds to RESET state 404. During RESET state 404, STRESET 402a is provided to initialize the general logic states of the various components of state machine 202, such as, for example, the initialization of high voltage generator 214 or timers 208, 210 and 212. Further, CLR_YADDR signal 402b is preferably configured to initialize column address counter 224, i.e., to clear counter 224 and then reset counter 224 to the initial Y address column. Upon resetting and clearing the various component parts during CLEAR state 402 and RESET state 404, state machine 202 preferably proceeds to state 406. State machine 202 suitably generates an output signal, EHVEN 404a, which indicates that state machine 202 is in a ready state for the erase high voltage sequence of the erasing function, i.e. state 406.

In high voltage ramp state (HV_ramp_S) 406, state machine 202 generates the high voltage necessary for erasing the contents of the flash memory cells. In state 406, state machine 202 may generate an output signal, for example, EHVEN signal 404a, to initiate erase setup timer 208. Upon initialization, erase setup block 208 preferably begins counting clock pulses 104a of clock 104, as shown in FIG. 5, until a predetermined number of clock pulses has been reached. In accordance with a preferred embodiment of the present invention, the predetermined number of clock pulses 104a counted by program setup block 208 is based on the time needed for high voltage generator 214 to ramp up to the desired high voltage level utilized for erasing the flash cell memory. In a preferred embodiment, this ramp up time is suitably in the range of 20 to 60 clock cycles, and more preferably between 30 to 40 clock cycles. Upon reaching the predetermined number of clock pulses, an output signal (TIMERREQ) 406b is preferably generated by state machine 102, and state machine 102 proceeds to state 408 to begin erasing the contents of the flash cells. Alternatively, rather than counting clock pulses in erase setup timer 208, in accordance with another aspect of the present invention, state machine 202 may monitor the high voltage produced by high voltage generator 214 to determine when the appropriate high voltage level has been reached before proceeding to state 408. Upon reaching the appropriate high voltage level, an internal signal, e.g. EHV_REACH signal 406a, is changed to a high state, i.e., EHV_REACH=1, and state machine 202 preferably proceeds to state 408 to begin the erasing of the flash cells.

The contents of the flash cell memory are erased in ERASE State 408. Here, erase timer 210 is initialized and high voltage signals are applied to the flash cells previously latched by microcontroller 150. In accordance with a preferred embodiment, the application of the high voltage to the flash cells generally occurs by a parallel load of decoder 118 onto the latched cells, thus facilitating the transition of the latched cell addresses to a high logic state. In accordance with a preferred embodiment, this parallel load occurs during 64 pulses of erase timer 210. Preferably, the clock frequency of clock 104 is reduced to a slower frequency during ERASE state 408, such as, for example, a clock pulse every 2.56 microsec, from a normal clock pulse rate of one every 120 nanosec, as described above. This slower frequency for clock 104 is generally in response to an output signal by state machine 202 to clock 104 which triggers clock 104 to reduce the frequency accordingly. Once program timer 210 has counted the predetermined number of pulses, e.g., 64 clock pulses, an internal signal, timeout 408a, is set high, i.e., timerout=1. Preferably thereafter, an output signal, TIMEOUT 206b, is generated by program timer 210 and sent to state machine 202 to indicate that the latched cells have been programmed to a high logic state, i.e., ERASE state 408 is complete. As discussed above, in accordance with a preferred embodiment, the voltage level in the high logic state utilized for erasing the flash cells is a different value than the high voltage value utilized for programming the flash cells. However, it will be appreciated that the voltage values may be substantially similar, or alternatively, essentially the same voltage levels without departing from the scope of the present invention.

Next, upon determining that ERASE state 408 has been completed, state machine 202 generates an output signal, e.g. DISCH-A signal 406c, which indicates that state machine 202 is ready to proceed to HIGH VOLTAGE DISCHARGE state 410. In state 410, in accordance with a preferred embodiment, high voltage generator 214 reduces the voltage to a lower level, e.g. it discharges the voltage to a low value state. Moreover, in accordance with this aspect of the invention, clock 104 is operating at slower frequency, such as described above in state 408. Accordingly, the discharging of the high voltage by generator 214 may be accomplished during one or more clock cycles. Alternatively, in accordance with an alternate preferred embodiment, rather than discharging the high voltage during a single clock cycle, state machine 202 may utilize a second state, HIGH VOLTAGE DISCHARGE 412, to continue discharging of the high voltage. In accordance with this alternate embodiment, during state 412, clock 104 may operate on a slower frequency or at a normal clock frequency as described above.

In accordance with a preferred embodiment of the present invention, upon discharging of the high voltage by generator 214, an erase verify signal, e.g. EVERX signal 412a, is generated by state machine 202 before proceeding to state 414. In accordance with one embodiment of the present invention, state machine 202 may proceed initially to a dummy state to allow for initialization or timing synchronization before proceeding to state 414 (WLSETUP). In accordance with an alternate preferred embodiment, state machine 202, after high voltage discharging, proceeds directly to WLSETUP state 414, i.e. without the use of a dummy state.

In accordance with a preferred embodiment during WLSETUP state 414, state machine 202 prepares to verify that the flash cells have been properly erased. In particular, during state 414, high voltage regulator 216 suitably switches the voltage level as reduced by generator 214 to a desired voltage level to be utilized for erase verification. Accordingly, high voltage regulator 216 suitably includes a voltage regulator to provide the desired voltage level to be applied by decoder 218 during verification to wordline 510. Moreover, during WLSETUP state 414, column address counter 224 and pulse counter 222 are preferably reset or cleared to allow state machine 202 to proceed with an initial column before verification. To determine completion of state 414, an internal signal, e.g. evwready signal 414a, is monitored by state machine 202; upon determining that signal 414a is triggered, state machine 202 preferably outputs a signal, e.g. TIMERREQ signal 414b, which indicates that state machine 202 is ready to proceed to a SENSE SETUP state 416.

In accordance with a preferred embodiment, during SENSE SETUP state 416, erase verify setup timer 212 is suitably initialized, preferably by receiving signal TIMER-REQ 414b. Erase verify setup timer 212 is suitably configured to allow adequate time for the voltage regulator of high voltage regulator 216 to stabilize the voltage in a low voltage state for use during erase verification. As long as an internal signal, e.g. timerout signal 416a, is in a low state, i.e., timerout=0, then SENSE SETUP state 416 will continue to allow the voltage to be stabilized and regulated by high voltage regulator 216 until the voltage reaches a predetermined value, e.g. Vt. Once timer 212 reaches a predetermined amount of clock pulses configured to permit high voltage regulator 216 to reach value Vt, timerout 416a preferably switches to a high state, i.e., timerout=1, and state machine 202 preferably transitions to state 418. Alternatively, to determine when value Vt has been obtained, state machine 202 may monitor the voltage level until value Vt is reached rather than utilizing timer 212 to count clock pulses. In accordance with this aspect of the invention, once value Vt has been reached, state machine 202 is ready to proceed to the verification stage of the erasing process.

Upon completing the verification setup stages of states 414 and 416, state machine 202 preferably outputs a signal to verify block 210 to initialize a VERIFY state 418. During VERIFY state 418, state machine 202 preferably selects an initial column of flash memory array 130 to verify. In accordance with the preferred embodiment, an erased flash cell may be identified by the indication of a small leakage current for that flash cell which is dispositive of a high value Vt. In other words, if a high value for Vt is achieved for a flash cell, i.e., the flash cell is erased, then a small leakage current will be detected for that flash cell. Alternatively, if a large amount of leakage current is detected, i.e., a low Vt value, then the flash cell is not deemed to be erased. Accordingly, state machine 202 suitably reads the leakage current values for the selected column, and compares those values to a standard column, e.g., values representing an effectively erased column of flash memory cells. Thus, in accordance with a preferred embodiment of the present invention, state machine 202 compares the current amplitude levels associated with the flash cells of the selected column of array 130 to standard current values; if the current measured for the column is less than the standard current, the flash cells in the selected column are deemed to be erased, and an internal signal, e.g. column success signal 420a, is set high, i.e., column success=1; if, on the other hand, the current measured is greater than the standard current, state machine 202 determines that an erase failure has been detected and column success 420a remains in a low state. In accordance with a most preferred embodiment of the present invention, if the current measured is at least 5 microns greater than the standard current, an erase failure is deemed to have occurred for that flash cell.

Upon measuring the current for the selected column, and comparing the measured values to the standard values, state machine 202 preferably proceeds to COLUMN VERIFY RESULT state 422 to determine whether all the flash cells of the selected column have been correctly erased, i.e. to determine whether erasing of contents of flash cells has been verified. If the selected column has been correctly erased, state machine 202 will preferably generate an output signal, e.g. INC_YADDR signal 418a, which is sent to column address counter 224. After receipt of signal 418a, column address counter 224 is preferably incremented and state machine 202 proceeds back to VERIFY state 418 to verify the next selected column, i.e., to determine whether the contents of the flash memory of the newly selected column have been properly erased. Preferably, column address counter 224 will continue to be incremented (or decremented) until it has reached a predetermined limit, e.g., the number of columns in array 130.

In accordance with a preferred embodiment of the present invention, before proceeding to COLUMN VERIFY RESULT state 422, state machine 202 may proceed to DUMMY WAIT state 420 to allow for synchronization of clock 104 or any of the various other counters or timers. Alternatively, state machine may proceed directly from VERIFY state 418 to COLUMN VERIFY RESULT state 422.

In accordance with the preferred embodiment, once all of the columns have been correctly verified in state 422, i.e., column success=1 and last address=1, state machine 202 preferably proceeds to ERASE DONE state 423. After reaching state 423, state machine 202 preferably proceeds to a DUMMY STOP state 428, wherein clock 104 is stopped; state machine 202 then proceeds back to START state 400 to await the next instruction from microprocessor 150.

In accordance with one aspect of the present invention, in the event that an erase failure is determined for a selected column in COLUMN VERIFY RESULT state 422, state machine 202 may proceed to the next column, i.e., increment column address counter 224, to verify that the contents of the flash cells for the next column have been erased. Alternatively, in accordance with a particularly preferred embodiment of the present invention, state machine 202 will not continue with the verification of the remaining columns through the operation of state machine 202 in states 418 and 420; rather state machine 202 proceeds to a CHKPLS state 424. In particular, during CHKPLS state 424, the pulses of pulse counter 222 are suitably checked to determine whether pulse counter 222 has exceeded a predetermined limit, e.g. 64 attempts at erasing the flash cells correctly. If pulse counter 222 has exceeded a predetermined limit, state machine 202 proceeds to an ERASE ERROR state 426 before proceeding to DUMMY STOP state 428. If, on the other hand, pulse counter 222 has not reached a predetermined limit, state machine preferably proceeds back to RESET state 404 to reinitiate the erase process for all of the flash memory cells to have been erased.

In accordance with a preferred embodiment, during ERASE ERROR state 426, state machine 202 generates an output signal, e.g. ERROR signal 202a that is sent to microprocessor 150 to indicate that the erase function has resulted in an erase failure. Accordingly, after stopping clock 104 in DUMMY STOP state 428, state machine 202 proceeds back to START state 400 to await the next instruction, e.g. an instruction from microprocessor 150.

In accordance with a preferred embodiment, state machine 202 may be suitably configured to permit the timely aborting of the erase function. More particularly, state machine 202 may contain an internal abort signal 430a that is monitored during the erase cycle. As long as abort signal 430a is low, i.e., abort=0, then state machine 202 will continue with the current erase cycle. However, in the event that abort signal 430a goes to a high state, i.e., abort=1, state machine 202 will exit the current erasing sequence and proceed to an ABORT DONE state 430. In accordance with the present invention, abort signal 430a is most preferably monitored during states 406 through 412. However, it will be appreciated that abort signal 430a may also be monitored during verification states 414 through 422 as well, and may be triggered by a wide variety of circumstances as described above. For example, ABORT signal 336 may be triggered by a plurality of circumstances, such as a signal from the microcontroller 150 as a result of a power failure or another internal error signal, a user request, or from flash chip 130 as a result from internal diagnostic failures, i.e., not communicating with microcontroller 150.

In summary, the present invention provides an improved technique and apparatus for automating the program and erase functions in a flash memory. The automation of the programming and erasing tasks as described herein effectively permits the host microprocessor system to perform other desired tasks during programming and erase processes, as well as reducing the amount of software overhead ordinarily required by other systems.

The present invention has been described above with reference to a preferred embodiments. However, various changes and modifications may be made to the systems described herein without departing from the scope of the present invention. For example, the various functional blocks may be implemented in alternate ways depending upon the particular application or in consideration of any number of cost functions associated with the design, implementation, and operation of the system. In addition, the techniques described herein may be extended or modified for use with other types of memory, such as, for example, volatile and nonvolatile memory, RAM, ROM or EEPROM-type memory. These and other changes or modifications are intended to be included within the scope of the present invention, as expressed in the following claims.

What is claimed is:

1. An apparatus for programming flash memory cells in a microcontroller-based electronic device, said apparatus comprising:

a state machine for controlling, in response to a command from a microcontroller, a sequence of operations for programming a plurality of said flash memory cells;

a high voltage charge pump for generating a high voltage signal to be applied to selected ones of said flash memory cells during programming;

a high voltage regulator for regulating said high voltage signal to a lower amplitude voltage for use during verification of the programming of said flash memory cells;

a decoder for selection of said flash memory cells to be programmed and verified;

a decoder for providing parallel loading of said high voltage signal onto selected ones of said flash memory cells during erasing of said flash memory cells, and to verify erasing of said flash memory cells on a column by column basis within a flash memory;

a dedicated clock for controlling timing operations associated with the programming of said flash memory; and a timer circuit for controlling a window of time for at least one of said sequence of operations, wherein said timer circuit further comprises:

a program setup timer for controlling an amount of time required for said charge pump to generate said high voltage signal, said program setup timer responsive to a first input signal from said state machine such that a charge pump setup time period is timed, and further configured to provide a first output signal to said state machine to indicate that said charge pump high voltage signal has ramped up to a desired high voltage level;

a program timer for controlling an amount of time said high voltage signal is applied to said flash memory cells during programming, said program timer responsive to a second input signal from said state machine such that a programming time period is timed, and further configured to provide a second output signal to said state machine to indicate that said programming of said flash memory cell is complete; and a program verify setup timer for controlling an amount of time for verifying a successful programming sequence for said flash memory cells, said program verify setup timer responsive to a third input signal from said state machine such that a verify setup time period is timed, and further configured to provide a third output signal to said state machine to indicate completion of said successful programming sequence for said flash memory cells, wherein said state machine reprograms only those of said flash memory cells not correctly programed after verification of all of said flash memory cells wherein said state machine controls a sequence for erasing said flash memory.

2. An apparatus according to claim 1, further comprising:

a program verify counter for limiting the number of times said state machine may attempt to program said flash memory cells.

3. An apparatus according to claim 2, further comprising:

a program byte counter for cooperating with said decoder in selecting which of said flash memory cells are to be programmed.

4. An apparatus according to claim 1, wherein said state machine reinitiates erasing of all of said flash memory cells upon detecting an erase failure in at least one said flash memory cell.

5. A method for automating the programming function in a flash memory, said method comprising the steps of:

initializing a state machine for controlling said flash memory;

providing a first signal to a timer circuit from said state machine so that a charge pump begins generating a high voltage signal for programming said flash memory;

providing a second signal to said state machine from said timer circuit so that said charge pump applies said high voltage signal to selected flash cells in said flash memory;

providing a third signal to said timer circuit from said state machine so that said charge pump begins resetting said high voltage signal to a lower voltage level to facilitate verification of said flash cells;

providing a fourth signal to said state machine from said timer circuit to verify the contents of all said flash cells to determine whether said flash memory has been effectively programmed; and reapplying said high voltage signal to a subset of said flash cells identified during said verifying step as embodying a programming failure after all of said flash cells have been verified.

6. A method according to claim 5, further comprising the step of erasing said flash memory, wherein said step of erasing further comprises the steps of:

generating a second high voltage signal for erasing said flash memory;

applying said second high voltage signal to selected flash cells in said flash memory to erase said flash cells; and verifying contents of said flash cells to determine whether said flash memory has been effectively erased, by verifying erasure of said flash cells on a column by column basis within said flash memory, and wherein said state machine reinitiates erasing of all of said flash cells upon detecting an erase failure in at least one of said flash cells, and reinitiates verification of all of said flash cells.

7. A control system for programming and erasing data in a microcontrolled-based device, said system comprising:

a microprocessor for controlling the operation of the microcontrolled-based device;

a flash memory array for storage of data, said array being operatively coupled to said microprocessor wherein said flash memory array comprises a plurality of flash cells;

a state machine controller for automating programming and erasing of data in said array, said state machine controller being operatively coupled to said microprocessor;

a dedicated clock configured to facilitate control of timing operations associated with the programming and erasing said flash memory array;

a high voltage charge pump for generating a high voltage signal to be applied to selected ones of said flash cells during programming and erasing;

a high voltage regulator for regulating said high voltage signal to a lower amplitude during verification of the programming and erasing of said flash memory array;

a decoder for identifying selected ones of said flash cells to be programmed, erased and verified; and a timer circuit for controlling the duration of respective timing windows associated with a plurality of program and erase sequences, said timer circuit further comprising:

a program setup timer circuit to control an amount of time for said high voltage charge pump to generate said high voltage signal to be applied to the flash memory array during programming, said program setup timer circuit responsive to a first input signal from said state machine controller such that a charge pump setup time period is timed, and further configured to provide a first output signal to said state machine controller to indicate that said charge pump voltage has ramped up to a desired high voltage level;

a program timer circuit to control an amount of time for applying said high voltage signal to said flash cells during programming, said program timer circuit responsive to a second input signal from said state machine controller such that a programming time period is timed, and further configured to provide a second output signal to said state machine controller to indicate that said programming of said flash cell is complete; and a program verify setup timer to control an amount of time for verifying a successful programming sequence for said flash cells, said program verify setup timer responsive to a third input signal from said state machine controller such that a verify setup time period is timed, and further configured to provide a third output signal to said state machine controller to indicate completion of said successful programming sequence for said flash cells, wherein said control system limits reprogramming of said flash cells to those that were not verified as being correctly programmed only after verification of all of said flash cells.

8. A control system according to claim 7, further comprising:

a verify counter to limit the number of permitted attempts of said state machine to program, erase and verify said flash cells.

9. A control system according to claim 8, further comprising:

a byte counter to assist said decoder in selection of said flash cells to be programmed, erased and verified.

10. The control system according to claim 7, wherein said decoder provides a parallel loading of said voltage signal onto said flash cells during erasing of said flash cells, and wherein said control system verifies erasing of said flash cells on a column by column basis within said flash memory, and wherein said state machine reinitiates erasing of all of said flash cells upon detecting an erase failure in at least one of said flash cells, and reinitiates verification of all of said flash cells.

* * * * *